(12) United States Patent
Bollmann et al.

(10) Patent No.: US 8,322,891 B2
(45) Date of Patent: Dec. 4, 2012

(54) LED LIGHT SOURCE ASSEMBLY WITH HEAT SINK AND HEAT CONDUCTIVE GLASS COVER

(75) Inventors: Klaus Bollmann, Horseshoe Bay, TX (US); Tom C. Penick, Leander, TX (US)

(73) Assignee: Ringdale, Inc., Georgetown, TX (US)

( * ) Notice: Subject to any disclaimer, the term of this patent is extended or adjusted under 35 U.S.C. 154(b) by 577 days.

(21) Appl. No.: 12/621,432

(22) Filed: Nov. 18, 2009

(65) Prior Publication Data

US 2010/0124057 A1    May 20, 2010

Related U.S. Application Data

(60) Provisional application No. 61/115,790, filed on Nov. 18, 2008, provisional application No. 61/122,379, filed on Dec. 14, 2008.

(51) Int. Cl.
 *F21V 29/00* (2006.01)

(52) U.S. Cl. ............... 362/294; 362/249.02; 362/311.02

(58) Field of Classification Search .................. 362/240, 362/249.02, 294, 311.02, 311.05, 396; 313/498, 313/506
See application file for complete search history.

(56) References Cited

U.S. PATENT DOCUMENTS 7,245,072 B2 * 7/2007 Ouderkirk et al. ............ 313/502

* cited by examiner

*Primary Examiner* — Vip Patel
(74) *Attorney, Agent, or Firm* — Hulsey, P.C.; William N. Hulsey, III; Loren T. Smith

(57) ABSTRACT

An LED assembly comprising an LED light source positioned between a heat sink and a heat conductive glass element, and at least one hold-down element, such that the hold-down element provides a compressive force to hold the heat conductive glass element against the LED light source, thereby pressing the LED light source against the heat sink. In one example, a ⅛ inch glass element with a surface area of five times the LED diffuser surface area is held over the LED light source by one or more sections of spring wire inserted through holes in the heat sink.

16 Claims, 3 Drawing Sheets

LED LIGHT SOURCE ASSEMBLY WITH HEAT SINK AND HEAT CONDUCTIVE GLASS COVER

This application is related to U.S. Provisional Patent Application No. 61/115,790 filed Nov. 18, 2008, and claims the priority date of that provisional patent application; and is related to U.S. Provisional Patent Application No. 61/122,379 filed Dec. 14, 2008.

BACKGROUND

1. Field of Invention

This application is related to LED lighting, and more specifically to reflector and heat sink assemblies for LED lighting.

2. Prior Art

LED Lighting is becoming as efficient as fluorescent lighting and also price competitive. However there are technological challenges for the construction of LED arrangements that are unique to the technology and not changeable.

Prior art includes LEDs that have a diffusion lens built into the LED body of a round nature and others that have LEDs on a strip with a flat surface. The current invention can be applied to both technologies.

All known manufacturers of LED arrangements have to use some form of significant cooling if they produce lasting and efficient LED lighting. This is particularly the case if used in hot countries +/−30 degrees latitude from the Equator.

The current invention allows significantly better heat dissipation as well as better thermal junction performance.

SUMMARY OF INVENTION

The term "LED" refers to light source components which include one or more light emitting diode; to lighting modules which include one or more such light source components; and to lighting systems which include a plurality of such lighting modules.

The term "LED light source" refers to one or more light emitting diode and to the combination of a light emitting diode with a diffuser.

The term "LED assembly" refer to one or more LED light source component in combination with a heat sink and a conductive glass cover element.

The terms "top" and "bottom" are relative to an upwards-facing orientation where the heat sink is below the LED light source. In practice, the assembly may be used in that upwards-facing orientation where light is emitted in an upward direction; or in a downwards-facing orientation such as a ceiling light fixture where light is emitted in a downward direction; or in applications such as billboard lighting where the assembly is provided at an angle relative to a horizontal reference.

In one embodiment of the current invention, a heat conductive glass is used as a cover plate for the LED, and mechanically secured to a reflector heat sink to improve the LED cooling capability and to increase light emission surface. The increased emission surface reduces glare. In one example, one of more sections of spring wire are inserted into holes in the reflector in a manner that provides a compressive force to hold the heat conductive glass against the LED.

By using a heat conductive piece of glass, several effects can be achieved including a) an LED or a group of LEDs can be pressed, by the glass, against a cooling heat sink to allow optimal junction contact;

b) an anti-corrosive substance can be added;

c) a junction resistance improving substance can be added (i.e. aluminum chemical weld);

d) some additional heat sink capability is provided by the glass; and e) at the same time, the glass can be used to diffuse LED generated light as required by the application.

Different applications may require different shapes of lenses or diffusers.

DESCRIPTION OF EMBODIMENT

Heat Sink Reflector with an LED Light Source and a a Heat Conductive Glass Cover Plate List of Elements The figures, which illustrate example embodiments of the current invention, include the following reference numbers.

| | |
|---|---|
| LED fixture | 80 |
| diffusing lens | 82 |
| "LED assembly" | 100 |
| "LED light source" | 120 |
| light emitting diode | 122 |
| diffuser | 124 |
| flat fine diffusing lens | 125 |
| "bulb" diffuser | 126 |
| heat sink reflector | 130 |
| side walls | 132, 134 |
| holes | 133, 135 |
| conductive glass cover element | 140 |
| top surface | 142 |
| diffuser pattern | 144 |
| bottom surface | 146 |
| hold down element | 150 |
| spring wire | 152 |

Figure 1A:
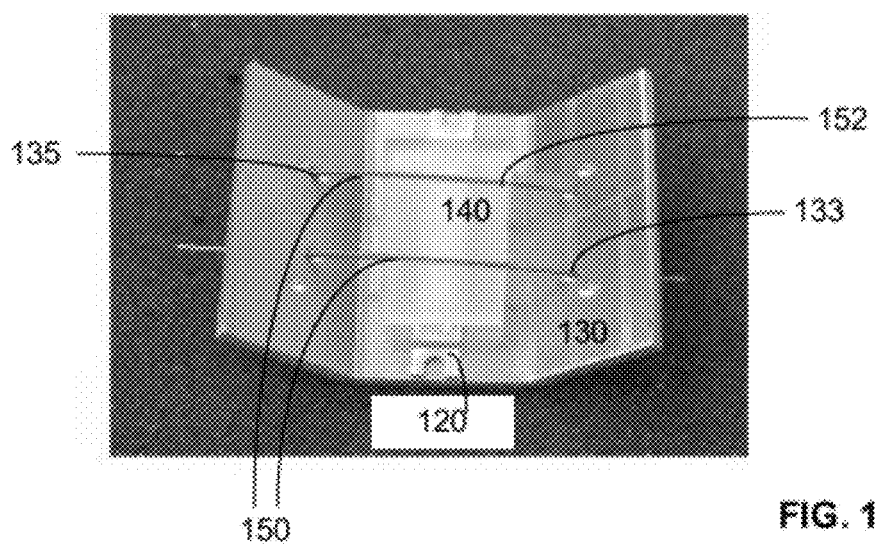
FIG. 1A is a top perspective view of an example embodiment of a heat sink reflector, an LED light source, and a a heat conductive glass cover plate held in place by two sections of stainless steel spring wire.
Figure 1B:
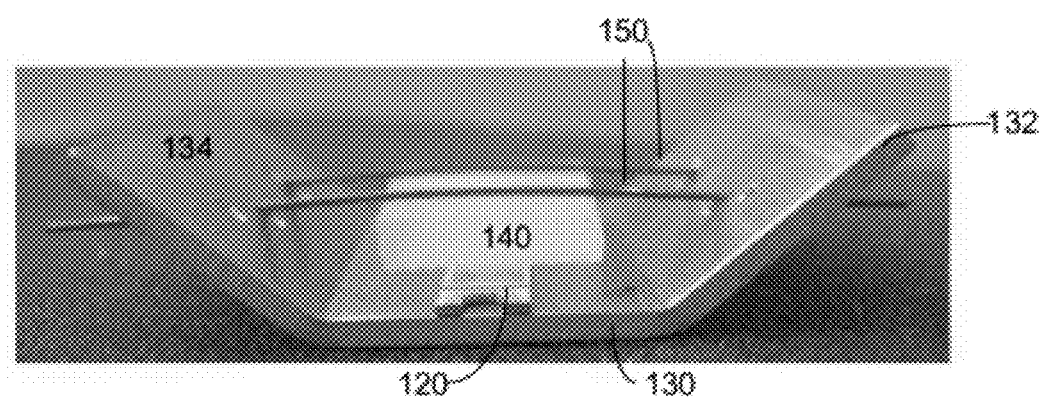
FIG. 1B is a side perspective view of the embodiment of FIG. 1A.

FIG. 1A is a top perspective view and FIG. 1B is a side perspective view of an example embodiment of a heat sink reflector 130, an LED light source 120, and a a heat conductive glass cover plate 140 held in place by hold down elements 150 comprising two sections of stainless steel spring wire 152. In this example, the reflector heat sink includes a first and second upward-oriented sides 132 and 134. The spring wire sections are inserted into holes 133 and 135 in the sides of the reflector heat sink. The heat sink may have a variety of holes to permit various thicknesses of LED light sources or cover plates.

In this example, the LED light source includes one or more diodes covered by a single flat fine diffusing lens 125. The heat conductive glass cover plate 140 has a surface area of 2 to 5 times larger than the surface area of the diffusing lens.

The planar heat conductive glass element 140 may be a Industrex™ glass having a thickness in the range of about 1/16 to 3/16 inch (1.6 to 4.8 mm) with a top surface and a bottom surface, where the top surface of the heat conductive glass element has an area in a range of about 2-10 5 times larger than the diffuser of the LED light source. A heat conductive glass element with a thickness of about 1/8 inch (3.2 mm) and an area of 5 times the LED diffuser area has worked well.

A 20 gage Type 302 stainless steel spring wire material with a diameter 0.032 inch (0.8 mm) has worked effectively as a hold-down element. In other examples, other hold-down elements may be used, such as a spring.

Figure 2A:
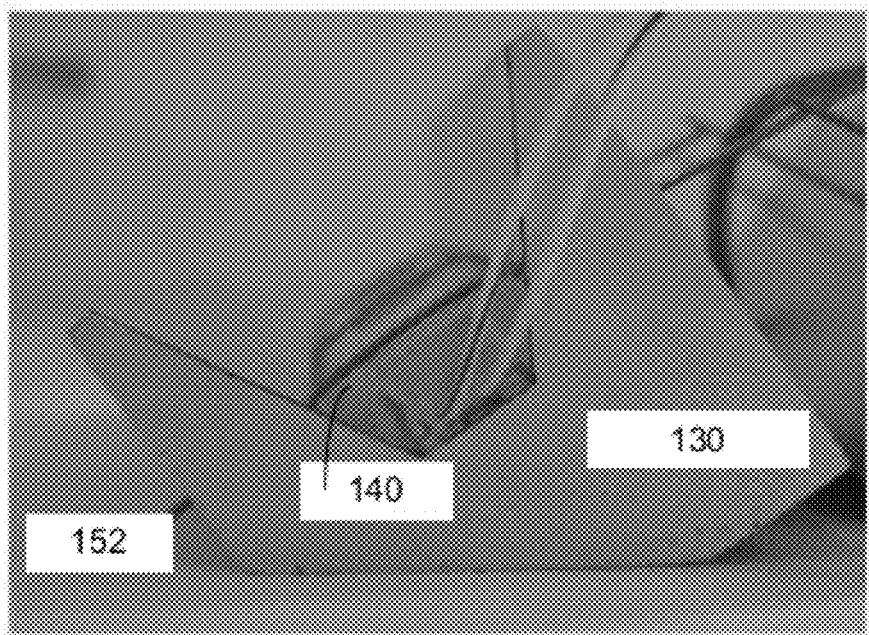
FIG. 2A is a side view of another example embodiment of a heat sink reflector, an LED light source, and a a heat conductive glass cover plate held in place by a plurality of sections of stainless steel spring wire.
Figure 2B:
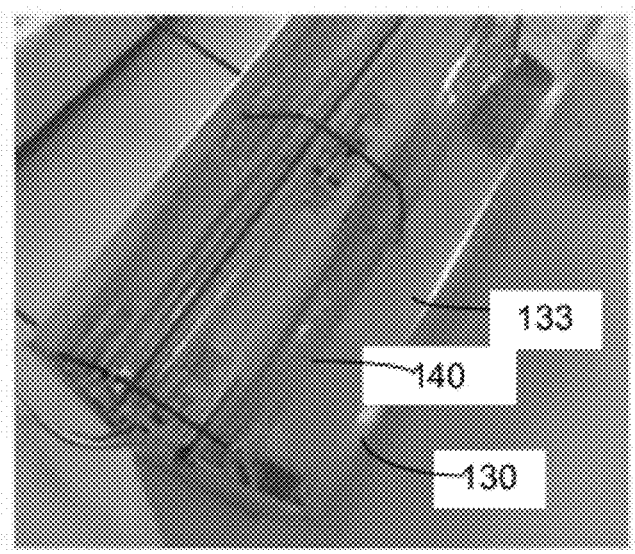
FIG. 2B is a top view of the embodiment of FIG. 2A.

FIG. 2A is a side view of another example embodiment of a heat sink reflector 130, an LED light source 120, and a a heat conductive glass cover plate 140 held in place by a plurality of sections of stainless steel spring wire. FIG. 2B is a top view of the embodiment of FIG. 2A.

Description of Embodiment

Figure 3:
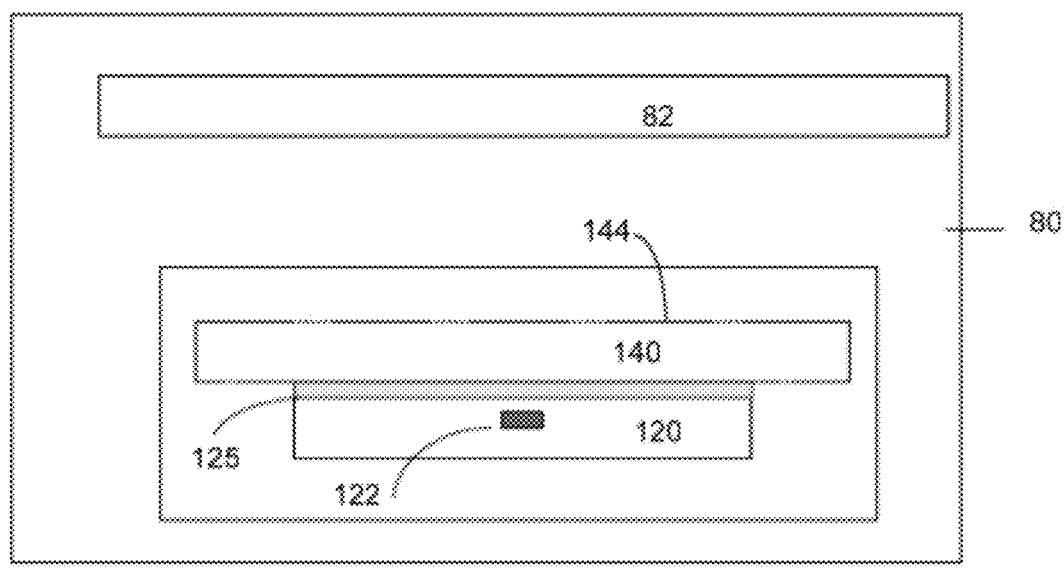
FIG. 3 is a cross section schematic of a fixture with an LED light source with a diode and diffuser, a heat conductive glass cover plate, and a diffusing lens.

LED Light Fixture with Heat Sink Reflector with an LED Light Source and a a Heat Conductive Glass Cover Plate FIG. 3 is a cross section schematic of a portion of a light fixture 80 with an LED light source 120 with a diode 122 and diffuser 124, a heat conductive glass cover plate 140, and a diffusing lens 82.

Prior art LED light sources typically provide a diode and a diffuser. Prior art LED light fixtures typically provide a plurality of relatively small LEDs mounted on a heat sink reflector, and provide a large diffusing lens 82 which is spaced apart from the LED light sources. The use of multiple LEDs helps to reduce glare.

In this embodiment of the current invention, one or more LEDs are mounted on a heat sink reflector, and a large diffusing lens 82 is provided. Additional light diffusion is provided by the heat conductive glass cover plate 120 which has a surface area of 2 to 5 times the surface area of the LED diffuser 124. This large cover plate helps to lessen the point-source "harshness" of the LED light source(s) and diffuse the light before it reaches an optional fixture diffusing lens 82. The diffusion can be further enhanced by providing a diffusion pattern on the top surface of the heat conductive glass cover plate 140. In some examples, the cover plate also reflects or blocks undesirable yellow light which is transmitted out the sides of the LED light source and provides a top-side heat sink for the LED light source(s). In one example, the cover plate is a 1/8 inch Industrex™ glass with an upward-facing fine scattering pattern. The diffusing lens 82 may be an Industrex™ glass with a fine scattering pattern facing the LED light source.

The current invention is not limited to the specific examples and embodiments described above.

What is claimed is:

1. An LED assembly comprising
a heat sink;
a heat conductive glass element;
an LED light source positioned between the heat sink and the heat conductive glass element; and
at least one hold-down element, such that the hold-down element provides a compressive force to hold the heat conductive glass element against the LED light source, thereby pressing the LED light source against the heat sink.

2. The LED assembly of claim 1 wherein the LED light source comprises a single diode.

3. The LED assembly of claim 2 wherein the LED light source further comprises a diffuser positioned over the diode.

4. The LED assembly of claim 1 wherein the LED light source comprises a plurality of diodes.

5. The LED assembly of claim 1 wherein the LED light source comprises a strip with a plurality of diodes.

6. The LED assembly of claim 1 wherein the hold-down element comprises a wire.

7. The LED assembly of claim 6 wherein the wire comprises
a first portion of wire inserted in a first hole provided in the heat sink; and
a second portion of wire inserted in a second hole provided in the heat sink.

8. The LED assembly of claim 1 wherein the hold-down element comprises a plurality of wires.

9. The LED assembly of claim 1 wherein the hold-down element comprises at least one spring.

10. The LED assembly of claim 1 wherein the heat sink further comprises a concave upper surface.

11. The LED assembly of claim 1 wherein the heat sink further comprises
a base having an upper surface;
a first side projecting upward from the base; and
a second side projecting upward from the base, such that the LED light source is positioned on the upper surface of the base between the first side and the second side, and the heat conductive glass element is positioned over the LED light source, and the hold-down element has a first end portion attached to the first side of the heat sink, and the hold-down element has a second end portion attached to the second side of the heat sink.

12. The LED assembly of claim 3 wherein
the heat conductive glass element is a planar glass element having a thickness in the range of 1/16 to 3/16 inch (1.6 to 4.8 mm) with a top surface and a bottom surface, and the top surface of the heat conductive glass element has an area in the range of 2 to 6 times larger than the surface area of the diffuser of the LED light source.

13. A method of improving heat control and diffused light characteristics of an LED assembly, the method comprising
providing a heat sink comprising a reflective concave upper surface;
positioning an LED light source on the upper surface of the heat sink, the LED having a light-emitting diode and a diffuser;
providing a planar heat conductive glass element having a thickness in the range of 1/16 to 3/16 inch (1.6 to 4.8 mm) with a top surface and a bottom surface, where the top surface of the heat conductive glass element has an area about 5 times larger than the diffuser of the LED light source;
positioning the heat conductive glass element over the LED light source, thereby increasing the diffusion of light from the LED light source;
attaching a first portion of a hold-down element to the heat sink; and
pressing the planar heat conductive glass element against the LED light source with the hold-down element, so that the LED light source is pressed against the heat sink, thereby providing improved heat transfer from the LED light source to both the heat sink and the heat conductive glass element.

14. The method of claim 13 wherein attaching a first portion of a hold-down element to the heat sink, and pressing the planar heat conductive glass element against the LED light source with the hold-down element further comprises providing a first hole in the heat sink on one side of the LED light source;

providing a second hole in the heat sink on a second side of the LED light source; and inserting a wire through the first hole and the second hole, thereby providing a compressive force on the heat conductive glass element against the LED light source.

15. The method of claim 13 further comprising providing a diffusion pattern on the top surface of the heat conductive glass element in order to increase the diffusion of light from the LED light source.

16. The method of claim 11 further comprising pressing the planar heat conductive glass element against the LED light source with the hold-down element, so that the LED light source is pressed against the heat sink, thereby providing improved heat transfer from the LED light source to both the heat sink and the heat conductive glass element, without the use of a sealant or other substance between either the LED light source and the heat sink or between the LED light source and the heat conductive glass element.

\* \* \* \* \*